United States Patent
Bazarsky et al.

(10) Patent No.: US 12,417,378 B2
(45) Date of Patent: Sep. 16, 2025

(54) SYSTEMS AND METHODS FOR USE WITH RECURRENT NEURAL NETWORKS

(71) Applicant: Western Digital Technologies, Inc., San Jose, CA (US)

(72) Inventors: Alexander Bazarsky, Holon (IL); Ariel Navon, Revava (IL); Ofir Pele, Hod Hasharon (IL)

(73) Assignee: Sandisk Technologies, Inc., Milpitas, CA (US)

( * ) Notice: Subject to any disclaimer, the term of this patent is extended or adjusted under 35 U.S.C. 154(b) by 1119 days.

(21) Appl. No.: 17/184,371

(22) Filed: Feb. 24, 2021

(65) Prior Publication Data

US 2022/0138541 A1 May 5, 2022

Related U.S. Application Data

(60) Provisional application No. 63/108,832, filed on Nov. 2, 2020.

(51) Int. Cl.
| | |
|---|---|
| *G06N 3/063* | (2023.01) |
| *G06N 3/08* | (2023.01) |
| *G11C 11/40* | (2006.01) |

(52) U.S. Cl.
CPC ............. *G06N 3/063* (2013.01); *G06N 3/08* (2013.01); *G11C 11/40* (2013.01)

(58) Field of Classification Search
CPC .......... G06N 3/063; G06N 3/08; G06N 3/044; G11C 11/40; G11C 11/54
See application file for complete search history.

(56) References Cited

U.S. PATENT DOCUMENTS

| | | | | |
|---|---|---|---|---|
| 10,303,397 | B1* | 5/2019 | Baryudin | G06F 3/0613 |
| 2015/0301755 | A1* | 10/2015 | Chodem | G06F 11/1612 |
| | | | | 714/764 |
| 2017/0228638 | A1* | 8/2017 | Danihelka | G06N 3/082 |
| 2020/0082900 | A1* | 3/2020 | Amato | G11C 29/52 |
| 2021/0042261 | A1* | 2/2021 | Milanovic | G06F 9/30036 |
| 2021/0311874 | A1* | 10/2021 | Ozcan | G06F 12/0246 |

OTHER PUBLICATIONS

Graves, Alex et al., "Hybrid computing using a neural network with dynamic external memory"; Nature; Oct. 12, 2016; https://www.nature.com/articles/nature20101; 21 pages.

* cited by examiner

*Primary Examiner* — Daniel T Pellett
(74) *Attorney, Agent, or Firm* — LOZA & LOZA, LLP; Gabriel Fitch

(57) ABSTRACT

Recurrent Neural Networks (RNNs) wherein a non-volatile memory (NVM) array provides a memory bank for the RNN. The RNN may be a Neural Turing Machine (NTM) and the memory bank may be an NTM matrix stored in the NVM array. In some examples, an NTM controller sets the size of the NTM matrix based on a storage access granularity of the NVM array. For instance, if the NVM reads and writes data in flash memory unit (FMUs), the NTM controller sets the size of the NTM matrix to correspond to the size of an integer number of FMUs. In some examples, the NVM array includes on-chip NTM circuitry configured to perform at least some NTM read head and write head operations. Threshold-based processing is described that can reduce an amount of NTM data read from the NVM array. In other examples, volatile memory is employed rather than an NVM array.

24 Claims, 14 Drawing Sheets

300 — *NTM Operations performed by NTM controller of DSD*

302 — Determine an NVM read/write granularity of the NVM array, such as the size of a flash memory unit (FMU), word-line, block or meta-block

304 — Set a size of the NxD matrix of the NTM based, at least in part, on the read/write granularity of the NVM array, such as by selecting values for N and M so that NxD is equal to the size of an integer number of FMUs

306 — Input labeled data (such as labeled training images) for use in training the RNN associated with the NTM

308 — Generate an initial set of NTM matrix elements (M) from the input labeled data and store the matrix elements of the NxD matrix in the NVM array

310 — Perform RNN training operations to train the RNN using the NTM matrix of the NVM array by performing NTM read and write operations on attentionally-selected portions of the NTM matrix with the read and write operations transferring data to/from the NTM matrix in FMUs

*FIG. 3*

*NTM Read operations performed by on-chip NVM array circuitry*

Operations performed by a controller coupled to an NVM array

900

902

Set a size of a Neural Turning Machine (NTM) matrix or memory bank based on NVM read/write access granularity to be equal to (or at least no greater than) the size of an integer (k) number of flash memory units (FMUs), word-lines, blocks, or meta-blocks

904

Store NTM matrix elements within the NVM array in accordance with the read/write granularity

906

Train a recurrent neural network (such as a Memory Augmented Neural Network (MANN)) using input label images or other data by performing read vector and write vector operations on the NTM matrix elements stored within the NVM array

*FIG. 9*

SYSTEMS AND METHODS FOR USE WITH RECURRENT NEURAL NETWORKS

CROSS-REFERENCE TO RELATED APPLICATIONS

This application claims priority to and the benefit of U.S. Provisional Patent Application No. 63/108,832, filed on Nov. 2, 2020 entitled, "SYSTEMS AND METHODS FOR USE WITH RECURRENT NEURAL NETWORKS," the entire content of which is incorporated herein by reference.

FIELD

The disclosure relates, in some aspects, to recurrent neural networks. More specifically, but not exclusively, aspects relate to systems and methods for implementing recurrent neural networks in connection with non-volatile memory (NVM) devices.

INTRODUCTION

Recurrent neural networks (RNNs) are artificial neural networks configured so that connections between nodes form a directed graph along a temporal sequence to allow the network to exhibit temporal dynamic behavior. Neural Turing Machines (NTMs), or more generally Memory Augmented Neural Networks (MANNs), are types of recurrent neural networks. An NTM has a neural network controller coupled to external memory resources with which the controller interacts using attentional mechanisms (e.g. mechanisms that focus the attention of the network on particular portions of data stored in the external memory). NTMs have the potential to accelerate the manner by which RNNs process information. There is an on-going need to provide improvements within NTMs, MANNs, and other RNNs.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage device that includes: a non-volatile memory (NVM) array having a storage access granularity; and a controller coupled to the NVM array and having a processor configured to: set a size of a recurrent neural network (RNN) memory bank for storage within the NVM array based on the storage access granularity of the NVM array; store RNN data within the RNN memory bank of the NVM array; and determine at least one RNN output value using the RNN data stored within the RNN memory bank of the NVM array.

Another embodiment of the disclosure provides a method for use by a controller coupled to an NVM array. The method includes: setting a size of a recurrent neural network (RNN) memory bank for storage within the NVM array based on the storage access granularity of the NVM array; storing RNN data within the RNN memory bank of the NVM array; and determining at least one RNN output value using the RNN data stored within the RNN memory bank of the NVM array.

Another embodiment of the disclosure provides a method for use by on-chip circuitry of an NVM array. The method includes: receiving a threshold and NTM weight values from a controller for applying to a corresponding NTM matrix stored within the NVM array; comparing the received weight values to the threshold to identify individual weight values that exceed the threshold; sequentially reading NTM matrix values from the NVM array that correspond to the identified weight values; multiplying the sequentially read NTM matrix values with the corresponding identified weight values; summing the results of the multiplication of the sequentially read NTM matrix values with the corresponding identified weight values; and outputting the summed results to the controller.

Another embodiment of the disclosure provides a different method for use by on-chip circuitry of an NVM array. The method includes: receiving a set NTM weight values from a controller for applying to a corresponding NTM matrix stored within the NVM array; identifying weight values in the set of weight values that exceed a first threshold and count or sum the identified weight values; invalidating, in response to a determination that the count or a sum exceeds a second threshold, a first set of memory array locations that store the NTM matrix and writing an updated NTM matrix to a second set of memory locations within the NVM array; and identifying, in response to a determination that the count or sum does not exceed the second threshold, portions of an updated matrix that have corresponding weights that exceed the first threshold and writing the portions of the updated matrix to second memory locations within the NVM array.

Still another embodiment of the disclosure provides neural network processing device that includes: a memory; and a processor coupled to the memory and configured to: store RNN matrix values corresponding to an RNN memory bank within the memory; determine a weight value for applying to a corresponding one of the matrix values; compare the weight value to a threshold; read the corresponding matrix value from the memory, in response to a determination that the weight value exceeds the threshold, and apply the weight value to the corresponding matrix value to determine at least one updated recurrent neural network value; and set the corresponding updated recurrent neural network value to zero or a constant value, in response to a determination that the weight value does not exceed the threshold. In one aspect, the RNN is one or more of a Memory Augmented Neural Network (MANN) and a Neural Turing Machine (NTM) network, and the processor is further configured to determine at least one RNN output value using the RNN data stored within the RNN memory bank of the memory. In one aspect, the memory is one of more of a random access memory (RAM) and a non-volatile memory (NVM).

Still yet another embodiment of the disclosure provides neural network processing method that includes: storing RNN matrix values corresponding to an RNN memory bank within a memory; determining a weight value for applying to a corresponding one of the matrix values; comparing the weight value to a threshold; reading the corresponding matrix value from the memory, in response to a determination that the weight value exceeds the threshold, and applying the weight value to the corresponding matrix value to determine at least one updated recurrent neural network value; and setting the corresponding updated recurrent neural network value to zero or a constant value, in response to a determination that the weight value does not exceed the threshold. In one aspect, the RNN is one or more of a Memory Augmented Neural Network (MANN) and a Neural Turing Machine (NTM) network, and the processor is further configured to determine at least one RNN output value using the RNN data stored within the RNN memory bank of the memory. In one aspect, the memory is one of more of a random access memory (RAM) and a non-volatile memory (NVM).

BRIEF DESCRIPTION OF THE DRAWINGS

FIG. 3 illustrates an exemplary method for setting a size of an NTM matrix based on a storage access granularity of an NVM array in which is it stored.

FIG. 9 is a flow chart that summarizes further exemplary operations performed by a controller coupled to an NVM array.

DETAILED DESCRIPTION

Figure 1:
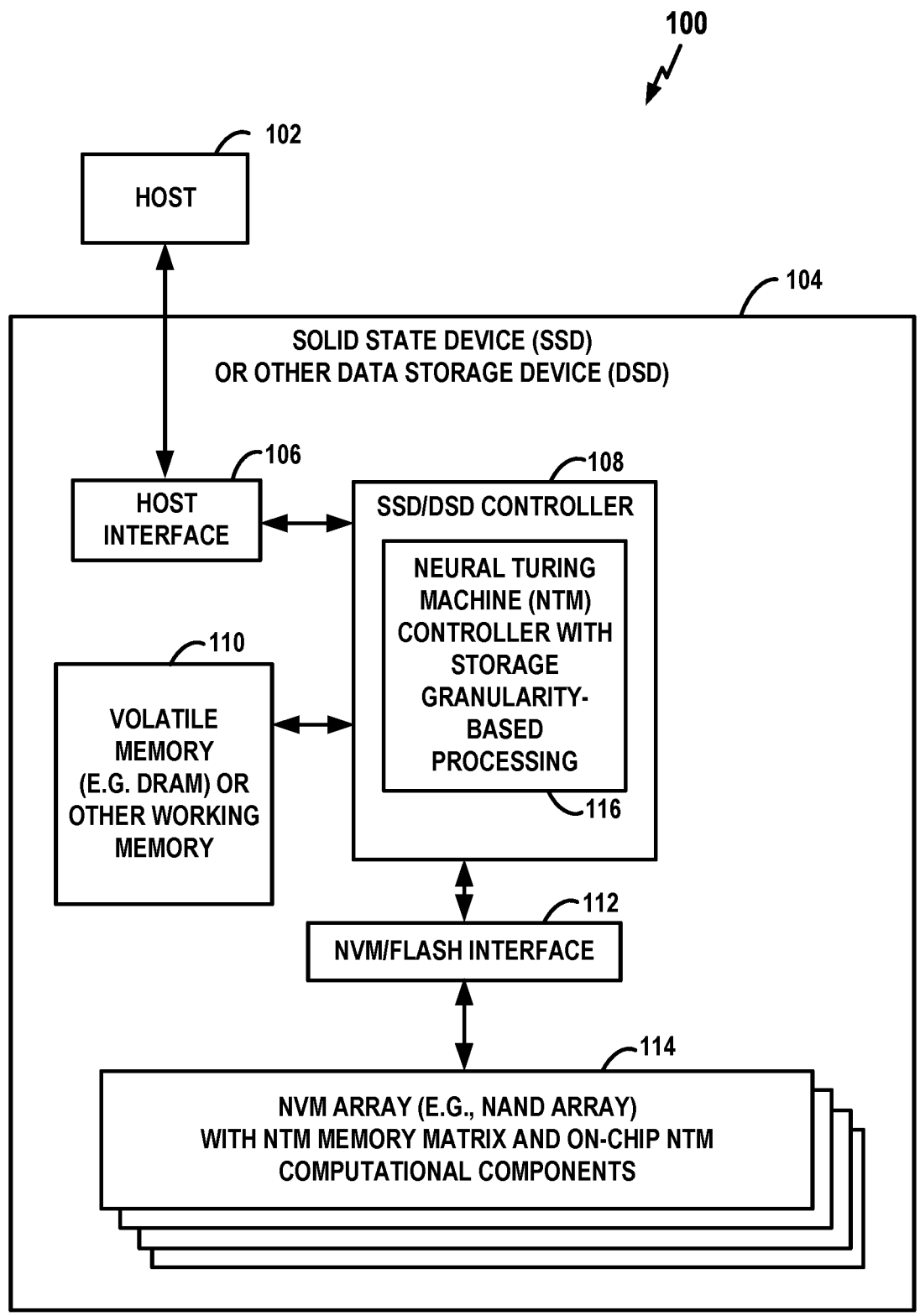
FIG. 1 is a schematic block diagram of a data storage device in the form of an exemplary solid state device (SSD), or other data storage device (DSD), having a non-volatile memory (NVM) array, wherein the array stores a Neural Turing Machine (NTM) matrix.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (DSD), such as a solid state device (SSD), and in particular to solid-state memory storage devices such as those that use NAND flash memory (herein "NANDs"). (A NAND is a type of non-volatile storage technology that does not require power to retain data. It exploits negative-AND, i.e. NAND, logic.) For the sake of brevity, an SSD having one or more NAND dies will be used as a non-limiting example of a DSD below in the description of various embodiments. It is understood that at least some aspects described herein may be applicable to other forms of data storage devices as well. For example, at least some aspects described herein may be applicable to a data storage or memory device including phase-change memory (PCM) arrays, magneto-resistive random access memory (MRAM) arrays, storage class memory, and resistive random access memory (ReRAM) arrays. In addition, the various embodiments may be used in various machine learning devices which may include some combination of processing elements and memory/data storage elements, including the NVM arrays constructed/configured in accordance with the described embodiments.

Overview

As noted above, recurrent neural networks (RNNs) are configured allow the network to exhibit temporal dynamic behavior. A Neural Turing Machine (NTM) is a type of RNN having a neural network controller coupled to external memory resources, wherein the controller exploits mechanisms that focus the attention of the network on particular portions of data stored in the external memory. NTMs have two major components: a neural network controller and a memory bank. The controller executes neural network operations on the memory bank to form substantially any type of neural network, including those with feed-forward components. The memory bank stores processed information within, e.g., a matrix of size N×D, having N vector rows where each row has D columns or dimensions. In one update iteration, the controller processes input and interacts with the memory bank to generate output. The interaction is handled by a set of parallel read and write "heads," which are computational components of the NTM architecture. An NTM read head outputs a weighted combination of memory locations, which may be referred to as a read vector, and which is fed back to the controller at the following time-step. An NTM write head modifies the memory "softly" (e.g. depending on its weights) with an erase and an add vector, both generated by the controller.

The memory part of a typical NTM architecture is a simple buffer that generally does not have computation capabilities. The memory may be, for example, random access memory (RAM). Every component of the NTM architecture is differentiable, making the network straightforward to train with gradient descent and back propagation. This may be achieved by defining "blurry" read and write operations that interact to a greater or lesser degree with all the elements in memory (rather than addressing a single element). The degree of blurriness is determined by an attentional focus mechanism that constrains each read and write operation to interact with a small portion of the memory, while ignoring the rest. That is, small or sparse portions of the memory are attentionally-selected. Because interaction with the memory is sparse, the NTM is biased toward storing data without interference. The memory location brought into attentional focus is determined by specialized output values emitted by the aforementioned heads.

These outputs define a normalized weighting over the rows of the memory matrix (referred to as memory "locations"). Each weighting—one per read or write head—sets the degree to which the head reads or writes at each location. A head can thereby attend strongly to the memory at a single location or weakly to the memory at many locations.

Insofar as reading is concerned, let $M_t$ be the contents of the N×D memory matrix at time t, where N is the number of memory locations, and D is the vector size or dimension at each location. Let $w_t$ be a vector of weightings over the N locations emitted by a read head at time t. Since all weightings are normalized, the N elements $w_t(i)$ of $w_t$ obey the following constraints:

$$\sum_i w_t(i) = 1, \ 0 \leq w_t(i) \leq 1, \ \forall \ i. \quad (1)$$

The read vector $r_t$ is defined as a linear combination of the row-vectors $M_t(i)$ in memory:

$$r_t \leftarrow \sum_i w_t(i) M_t(i), \quad (2)$$

which is differentiable with respect to both the memory and the weighting.

Insofar as NTM writing is concerned, writes are divided into two parts, an erasure operation followed by an addition operation. Given a weighting $w_t$ emitted by a write head at time t, along with an erase vector $e_t$ whose M elements all lie in the range (0, 1), the memory vectors $M_t-1(i)$ from the previous time-step may be modified as follows:

$$\tilde{M}_t(i) \leftarrow M_{t-1}(i)[1-w_t(i)e_t], \quad (3)$$

where 1 is a row-vector of all 1's, and the multiplication against the memory location acts point-wise. Therefore, the elements of a memory location are reset to zero only if both the weighting at the location and the erase element are one. If either the weighting or the erase is zero, the memory is left unchanged (that is, erasure here means setting to zero). When multiple write heads are present, the erasures can be performed in any order, as multiplication is commutative. Each write head also produces a length D and vector $a_t$, which is added to the memory after the erase step has been performed:

$$M_t(i) \leftarrow \tilde{M}_t(i) + w_t(i)a_t. \quad (4)$$

Note again that the order in which the additions are performed by multiple heads is irrelevant. The combined erase and add operations of all the write heads produces the final content of the memory at time t. Since both erase and add are differentiable, the composite write operation is differentiable as well. Note also that both the erase and add vectors have D independent components, allowing fine-grained control over which elements in each memory location are modified.

Typically, an NTM uses a RAM as its external memory resource. The NTM matrix is maintained within the RAM and all computations are performed within the NTM controller based on data read from and written to the RAM. That is, the aforementioned read and write heads are components of the controller that operate on data stored in the RAM. (Note that, conventionally, the NTM controller is a different and separate component from a memory access controller that might be associated with the operation of a memory device. For example, the conventional NTM controller is a separate device from a RAM controller. Hence, the overall system may include an NTM controller, a RAM controller, and the RAM itself.) The NTM controller may be configured to control the RNN based on the inputs to and outputs from the RAM so as to optimize RNN algorithmic performance based on labels supplied externally in a training phase. The RAM merely stores data and performs no NTM computations.

Herein, NTM configurations and architectures are described that may instead use a non-volatile memory (NVM) array to store the NTM memory matrix, such as a flash storage device. In some examples, the NTM controller is configured to set the size of the memory matrix based on a storage access granularity of the NVM array, where the storage access granularity or read/write access granularity refers to the minimum amount of data that the NVM array reads or writes in each read or write operation, such as one flash memory unit (FMU).

For example, if the NVM array is configured to store and retrieve data using FMUs, then the NTM controller may set the total size of the NTM matrix to the size of an integer (or multiple) number of FMUs. If the NVM array is configured to store and retrieve data using blocks, the NTM controller may set the total size of the NTM matrix to the size of an integer number of blocks. If the NVM array is configured to store and retrieve data using meta-blocks, the NTM controller may set the total size of the NTM matrix to the size of an integer number of meta-blocks.

In some examples, an NVM die may be configured with on-chip NVM computational components, such as NTM read head or write head components. Using an NVM as the external memory resource for the NTM and employing at least some on-chip (i.e. in-memory) computational capabilities may offer advantages over RAM-based systems, such as low cost and lower power consumption, albeit with higher latency (which may be reduced with dedicated flash commands in the NTM controller). In other examples described herein, a bit-addressable volatile memory is instead used (e.g. RAM or fast non-volatile memory such as storage class memory, MRAM, ReRAM, PCM)), along with a modified NTM controller that is configured, as will described below, to expedite at least some NTM computations and reduce the amount of data transfer between the RAM and the NTM controller. In some examples, the NTM controller is a component of a host computing system.

Exemplary Data Storage Device with NVM-based NTM Memory Matrix/Bank

FIG. 1 is a block diagram of a system 100 including an exemplary SSD (or DSD) having an NVM with an NTM memory matrix or other RNN memory bank and on-chip NTM computational components. The system 100 includes a host 102 and a SSD 104 or other DSD coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may also provide labels for training the NTM. The host 102 may be any system or device with a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally or alternatively, the host 102 may be a system or device having a need for neural network processing, such as speech recognition, computer vision, and self-driving vehicles. For example, the host 102 may be a component of a self-driving system of a vehicle.

The SSD 104 includes a host interface 106, an SSD/DSD controller 108, a volatile memory 110 (such as DRAM) or other working memory, an NVM interface 112 (which may be referred to as a flash interface), and an NVM array 114, such as one or more NAND dies configured to store an NTM memory matrix (with, e.g., the size of the matrix set by an NTM controller 116 based on a storage access granularity of the NVM array 114). The NVM array 114 may also include on-chip NTM computational components, described below.

The host interface 106 is coupled to the controller 108 and facilitates communication between the host 102 and the controller 108. The controller 108 is coupled to the memory 110 as well as to the NVM array 114 via the NVM interface 112. The host interface 106 may be any suitable communication interface, such as a Non-Volatile Memory express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

Although, in the example illustrated in FIG. 1, SSD 104 includes a single channel between controller 108 and NVM die(s) 114 via interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 108 may be implemented in a single integrated circuit chip and may communicate with different layers of memory in the NVM die(s) 114 over one or more command channels.

The controller 108 controls operation of the SSD 104. In various aspects, the controller 108 receives commands from the host 102 through the host interface 106 and performs the commands to transfer data between the host 102 and the NVM array 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The volatile memory 110 may be any suitable memory, computing device, or system capable of storing data. For example, the memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or other fast non-volatile memory such as storage class memory (e.g., MRAM, ReRAM, PCM) or the like. In various embodiments, the controller 108 uses the memory 110, or a portion thereof, to store data during the transfer of data between the host 102 and the NVM array 114. For example, the memory 110 or a portion of the memory 110 may be a cache memory. The NVM array 114 receives data from the controller 108 via the NVM interface 112 and stores the data. The NVM array 114 may be any suitable type of non-volatile memory, such as a NAND-type flash memory or the like. In some embodiments, volatile memory 110 may be replaced by a non-volatile memory such as MRAM, PCM, ReRAM, etc. to serve as a working memory for the overall device.

In the example of FIG. 1, the controller 108 may include hardware, firmware, software, or any combinations thereof that provide an NTM, MANN, and/or RNN controller 116 for use with the NVM array 114. Among other functions, the NTM controller is provided with storage granularity-based processing for setting the size of the NTM matrix stored within the NVM array 114 based on the storage access granularity of the NVM array 114. The NTM controller 116 may also be configured to perform various NTM operations on the data in the NVM array 114 such as NTM read head and NTM write head operations.

Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for NTM processing that are described herein. The processor could, as one example, off-load certain NTM processing tasks to the NVM and associated circuitry and/or components. As another example, the controller 108 may be a controller in another type of device and still include the NTM controller 116 and perform some or all of the functions described herein.

Figure 2:
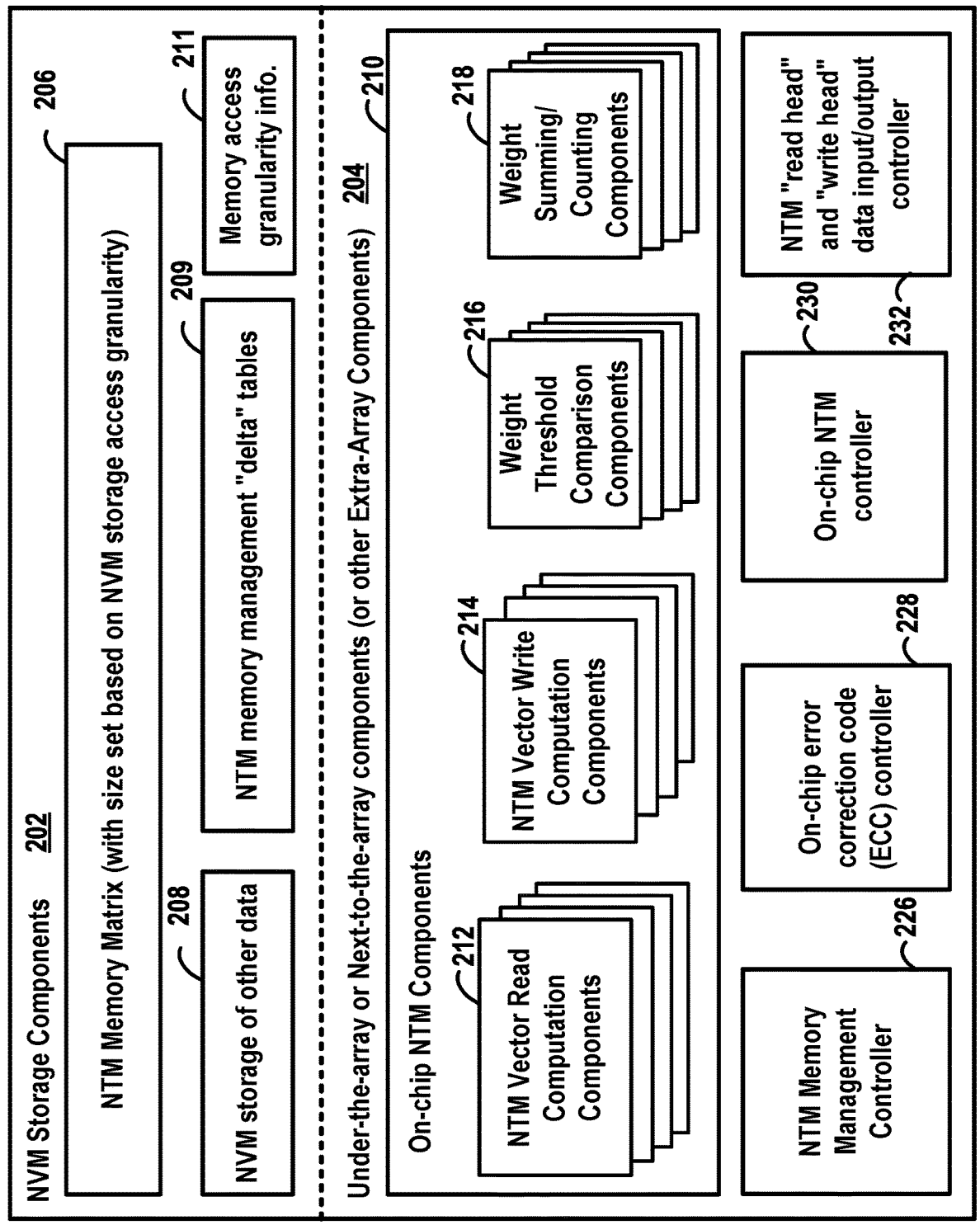
FIG. 2 illustrates an exemplary NVM array die that stores an NTM matrix and includes on-chip extra-array components configured for at least some NTM processing.

FIG. 2 illustrates a block diagram of an exemplary NVM die 200 that includes NVM storage components 202 and under-the-array or next-to-the-array (or other extra-array) processing components 204. Not all circuit or memory components that might be used in a practical NVM die are illustrated in the figure, such as input and output components, voltage regulation components, clocks and timing components, etc. Rather only some components and circuits are shown, summarized as block or schematic diagrams.

The exemplary NVM storage components 202 include: an NTM memory matrix or memory bank 206 (having its size set by the NTM controller of FIG. 1 based on NVM storage access granularity); NVM storage 208 for storing other data such as user data or system data; NVM storage for storing memory management "delta" tables 209 (described below);

and NVM memory access granularity information and parameters 211 that indicate, for example, whether access is based on FMUs, blocks, meta-blocks, etc. The storage component parameters 211 may be, for example, part of a boot partition that the controller 108 of FIG. 1 accesses on boot up to determine the NVM read/write access granularity for setting up page tables or the like.

The NVM extra-array processing components 204 of NVM die 200 include, in this example, on-chip NTM components 210 configured to perform or control at least some NTM computational operations. In the example of FIG. 2, the exemplary on-chip NTM components 210 include: one or more NTM vector read computation components 212 configured to perform at least some vector read operations on data stored in NTM memory matrix 206 (which may include at least some of the aforementioned read head computations); one or more NTM vector write computation components 214 configured to perform at least some vector write operations on data stored in NTM memory matrix 206 (which may include at least some of the aforementioned write head computations); one or more weight threshold comparison components 216 configured to perform certain threshold comparison operations to be described below; and one or more weight summing and/or counting components 218 configured to sum and/or count certain weights, as will be described below. Multiple instances of each on-chip NTM component (212, 214, 216, and 218) are shown since, in some examples, a plurality of such devices may operate in parallel, either within a particular die or across an array of dies.

The NVM extra-array processing components 204 of FIG. 2 also include various other components including: an NTM memory management controller 226 configured to update the memory management tables 209 (as will be described below); an on-chip error correction code (ECC) controller 228 configured to control any on-chip ECC applied to data as it is read from the NVM array components 202 to address bit error rate (BER) issues; an on-chip NTM controller 230 configured to control the various on-chip NTM components; and an NTM "read head" and "write head" data input/output controller 232 configured to input/output NTM data associated with NTM read head and write operations to/from the controller 108 of FIG. 1, at least in implementations where the NVM die 200 performs such operations on-chip.

In the following, exemplary NTM systems and procedures are described where the NVM memory matrix is stored in a NVM array. In other examples, exemplary NTM systems and procedures are described where the NVM memory matrix is stored in volatile memory.

NVM Read/Write Granularity-Based NTM Matrix Size Selection

FIG. 3 illustrates an exemplary method 300 for use with NTM processing according to aspects of the present disclosure wherein the size of an NTM matrix stored in an NVM array is determined, at least in part, based on the read/write granularity of the NVM array.

Beginning at block 302, the NTM controller (e.g. controller 116 of FIG. 1) determines the NVM read/write granularity of the NVM array, which may be specified, e.g. as FMU size, block size, word-line size, or meta-block size. For example, the NVM array (e.g. 114 of FIG. 1) may be configured to read and write data in FMUs. That is, the NVM array may be FMU-addressable. The determination of the size of an individual FMU may be made, in some examples, based on information retrieved from a boot partition of the NVM array during boot-up or from other components of the DSD, such as its NVM/flash interface (e.g. interface 112 of FIG. 1). In some instances, each FMU may include 1 kilobyte (KB) of data, 4 KB of data, 8 KB of data, or some other particular amount of data. In an example where an FMU is 1 KB, the granularity is 1 KB. If an FMU is 4 KB, then the granularity is 4 KB, and so on. Hence, in devices where the NVM array is FMU-addressable, the read/write granularity of the NVM array may be determined based on the size of an FMU. Note that in devices that read/write data at the FMU level, erase operations may be performed at a different level, such as at block level. The terms "read/write granularity" and "storage access granularity" are used herein, at least in part, to help distinguish read and write access granularity from erasure granularity or other types of granularity that may be associated with the NVM array.

In other DSDs, an NVM array may be wordline-addressable or block-addressable rather than FMU-addressable and, if so, the granularity is determined based on the size of a word-line or a block. A wordline may be, for example, 16 KB and a block may have, for example, one hundred word-lines. In some DSDs, blocks may be configured as meta-blocks that extend over multiple NVM dies of an NVM array. That is, an array may be meta-block-addressable. Hence, in some examples, the granularity is equal to the size of a meta-block. Storage of data in meta-blocks over multiple dies allows for parallel read/write efficiencies.

At block 304, the NTM controller determines or sets a size of the N×D matrix of the NTM based, at least in part, on the read/write granularity of the NVM array, such as by selecting values for N and D so that N×D is equal to an integer number of FMUs. In one example, N and D are selected so that N×D is equal to the size of 1 FMU. That is the memory space (or number of bytes) associated with the N×D matrix is equal to the memory space (or number of bytes) associated with 1 FMU. In another example, N and D are selected so that N×D is equal to the size of 2 FMUs. (More generally, N and D may be selected so that N×D is equal to the size of k FMUs, where k is an integer, k=1, 2, 3, 4, . . . )

Figure 4:
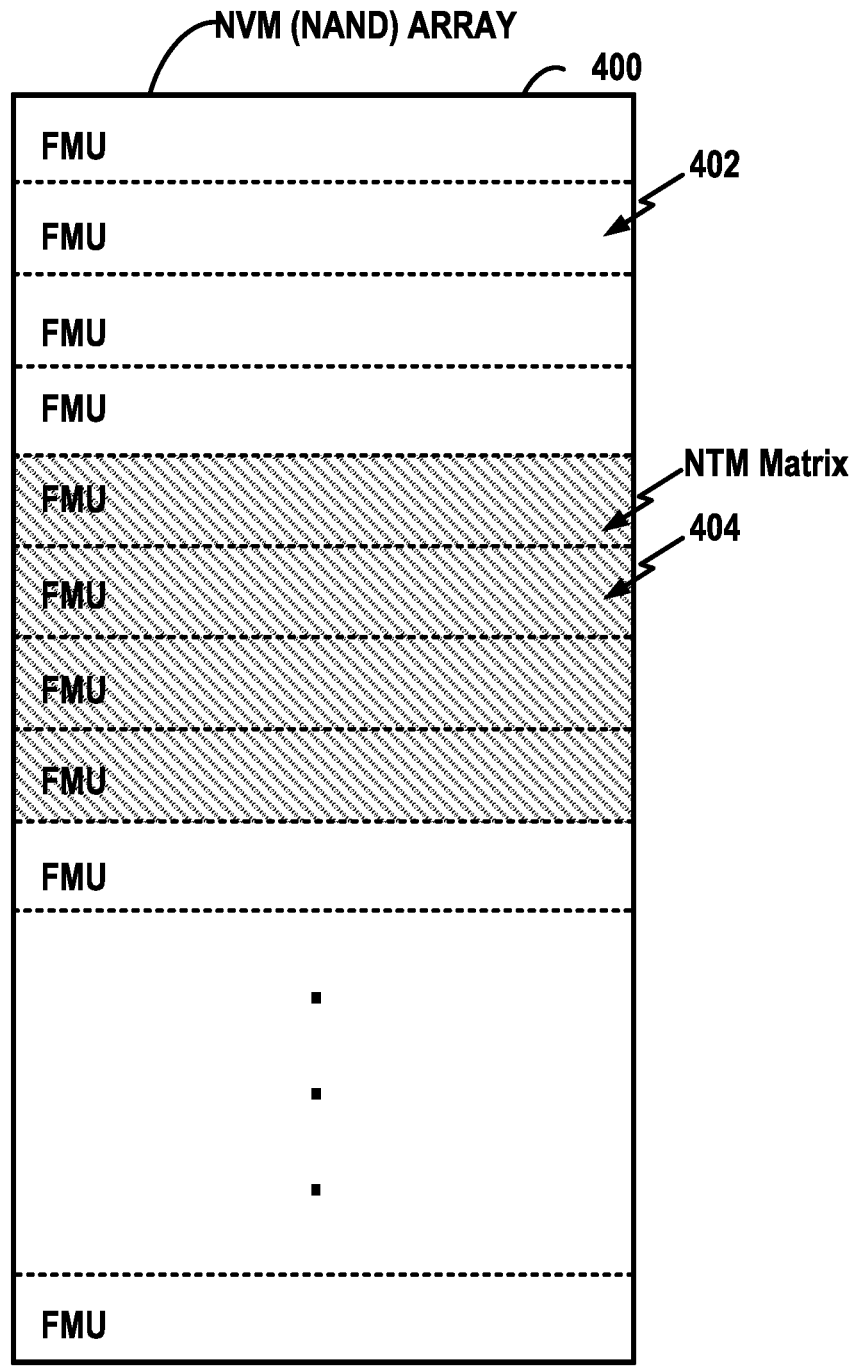
FIG. 4 illustrates an exemplary NVM array with Flash Memory Unit (FMU) granularity and also illustrating an NTM matrix sized to match an integer number of FMUs.

FIG. 4 illustrates an exemplary FMU-addressable NAND array 400 showing its FMU granularity by way of a set of FMUs 402 of equal size. The figure also illustrates that, in this particular example, an NTM matrix 404 (shown with cross-hatched lines) is sized to correspond with the size of an integer number of FMUs, in this case, four FMUs. That is, the N and D parameters of the matrix 404 are set so the data elements (not separately show) of the matrix fit within an integer number of FMUs, in this case four FMUs, for efficient read and write access.

The determination of values for N and D at block 304 may be performed in conjunction with other factors related to the needs or preferences of the particular RNN associated with the NTM. For example, if the particular RNN benefits from or requires a particular value for D, then the value of N may be determined by regarding D as a fixed value (e.g. D=10) and then computing N so that N×D yields an integer number of FMUs (while also taking into account the number of bytes needed to store each element of the matrix). In an illustrative example, if an FMU is 4 KB and D is 10, then N may be set based on the number of matrix elements that may be conveniently stored within 400 bytes. If each element of the matrix is represented by, for example, two bytes of data, then N may be set to 200. In this manner, the entire matrix may be stored in one FMU, and hence the matrix can be efficiently read from and written to by the flash controller or other solid state controller of the FMU-addressable NVM array. Note that, in this illustrative example, N need not be set so that a row corresponds to exactly 400 bytes by data. Rather, N may be set so a row corresponds to an amount of data no greater than 400 bytes of data. If the amount of data per row is less than 400 bytes, the excess bytes in the row may be left as padding without any significant loss of storage access efficiency. In other words, N and D need not be set so the matrix size is exactly an integer number of FMUs. The matrix size can be smaller in some examples without significant loss of storage access efficiency. For instance, if the granularity is k FMUs, the matrix size may be set to a size (e.g. the number of bytes) that is less than or equal to the size (e.g. the number of bytes) of k FMUs but greater than the size (e.g. the number of bytes) k−1 FMUs. That is, the size of the RNN memory bank may be set to be less than the size of an integer number of FMUs and greater than the size of the integer number minus one of FMUs. In other words, the matrix size may be set to a memory size corresponding to a fractional number of FMUs.

In systems where the RNN benefits from or requires a particular number of vectors (i.e. a particular value for N) the value of D may be determined by regarding N as a fixed value and then computing D so that N×D yields an integer number of FMUs (while again also taking into account the number of bytes needed to store each element of the matrix).

In systems where N and D are both adjustable, the NTM controller 116 may begin by using otherwise conventional techniques to determine initially preferred values for N and D, and then the NTM controller 116 adjusts N or D or both by an amount sufficient so that N×D equals an integer number of FMUs. In some examples, this may involve decrementing D while incrementing N to yield an integer number of FMUs.

Returning to FIG. 3, at block 306, the NTM controller 116 inputs labeled data (such as labeled RNN training images) for use in training the RNN associated with the NTM. At block 308, the NTM controller 116 generates initial set of NTM matrix elements (M) from the input labeled data and stores the matrix elements of the N×D matrix in the NVM array. At block 310, the NTM controller 116 performs RNN training operations to train the RNN using the NTM by performing NTM read head and write head operations on attentionally-selected portions of the NTM matrix with the read head and write head operations transferring data to/from the NTM matrix in FMUs. Exemplary read head and write head operations that are applied to attentionally-selected portions of the NTM matrix are set forth above in Equations (1)-(4), above. As already explained, by setting the N×D size of the matrix based on the read/write granularity of the NVM array, read/write storage access efficiencies may be gained.

Figure 5:
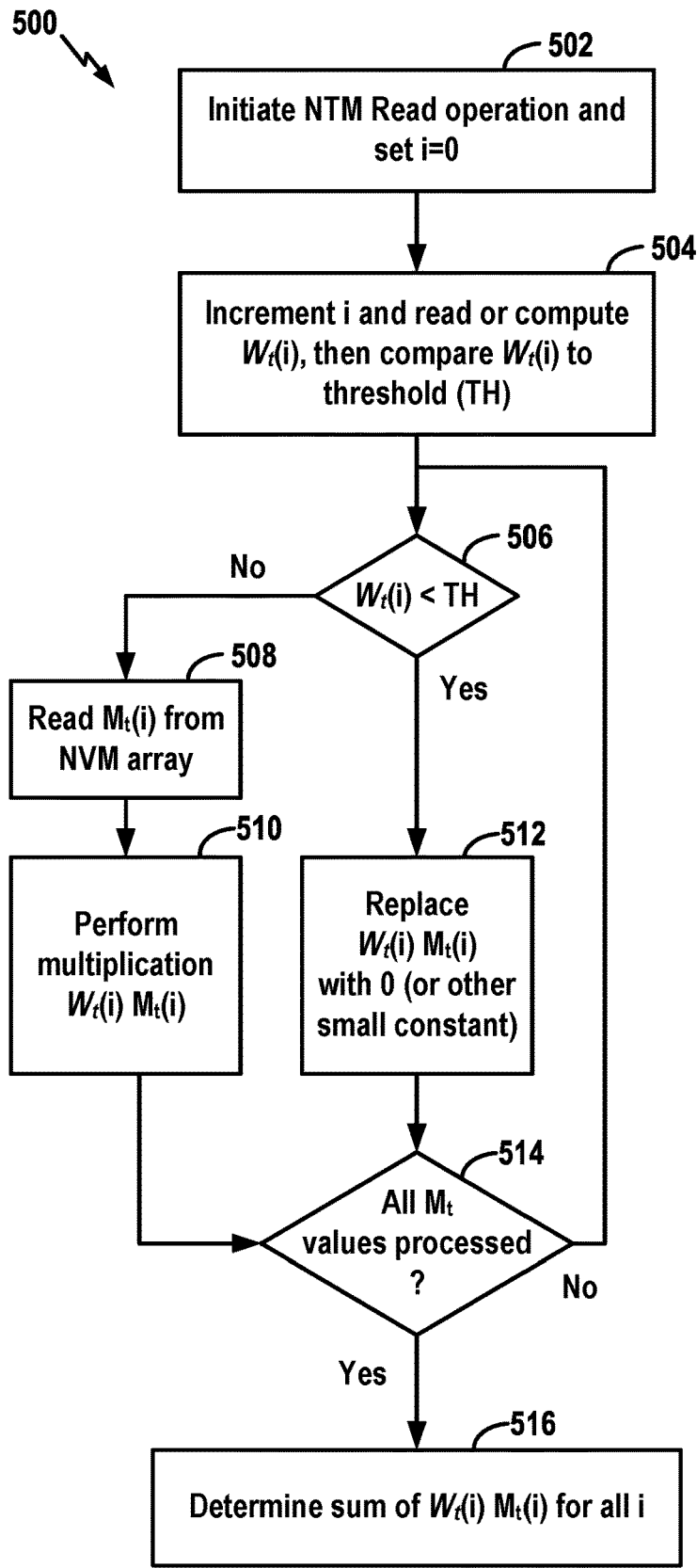
FIG. 5 illustrates an exemplary threshold-based method for use by an NTM controller for determining whether to read data from an NTM matrix of an NVM array.

Threshold-Based NTM Read Processing in NTM Controller Using NVM Matrix Data in NVM FIG. 5 illustrates an exemplary method 500 for use with NTM read head processing according to aspects of the present disclosure wherein, in response to a determination by an NTM controller during an NTM read operation that a NTM weight value (e.g. $W_t(i)$) is sufficiently small, the NTM controller does not bother reading the corresponding matrix element (e.g. $M_t(i)$) from the matrix of the NVM array and instead sets the corresponding read vector value (e.g. $W_t(i)M_t(i)$) to zero. This can save processing time resources by not reading matrix elements from the NVM array in circumstances where the resulting read vector value is very small and hence contributes little to the resulting read vector sum.

In this regard, when a memory buffer or matrix M is composed of an FMU (or an entire memory block or several wordlines), checking the weight $W_t$ against the threshold before performing a read operation helps avoid redundant or unnecessary operations. As described above, the weights indicate a multiplication factor on the operation result. NTM memory access is usually "sparse" (i.e. the vast majority of the weights are close to 0). This sparseness is maintained to keep all the data differentiable and as "continuous" as feasible. In order to avoid excessive reads, an approximation of the standard NTM read thus may be used. Since reads and writes are expensive performance-wise, checking $W_t(i)$ for each memory location (when i represents, e.g. an index of a single FMU) may be performed before the operation is conducted to decide whether to perform the operation or instead set the result to 0 or some small constant.

Beginning at block 502, the NTM controller (e.g. controller 116 of FIG. 1) initiates an NTM read operation (such as the read operation shown in Eq. (2) above) and sets a counter i to 0. At block 504, the NTM controller increments i (i.e., i is set to i+1) and then the NTM controller reads or computes the corresponding weight $W_t(i)$ for i. If $W_t(i)$ is already computed and stored in volatile memory, the NTM controller reads the value. If not, the NTM controller computes the value for $W_t(i)$ using otherwise conventional NTM computation techniques, which can involve iterative computation of $W_t(i)$ based on prior versions of $W_t(i)$ along with a content weight vector $W^c_t(i)$. The details of the computation of $W_t(i)$ values are beyond the scope of this disclosure but are well-known to those skilled in the art.

At block 504, the NTM controller also compares the value for $W_t(i)$ against a threshold (TH), which may be set to a low value, such as 0.0001 or another suitable value in the range of 0.00001 to 0.01. As shown by decision block 506, if the $W_t(i)$ is not below the threshold, the NTM controller, at block 510, reads the corresponding matrix element $M_t(i)$ from the NVM array, at block 508, and computes $W_t(i)M_t(i)$, as in Eq. (2) above.

On the other hand, if at decision block 506, the value for $W_t(i)$ is found to be below the threshold (TH), i.e. $W_t(i)$ is relatively very small, then the NTM controller does not read the corresponding matrix element $M_t(i)$ from the NVM array and instead sets $W_t(i)M_t(i)$ equal to zero or some other small constant, at block 514. That is, as noted above, if $W_t(i)$ is very small, the NTM controller does not bother reading the corresponding matrix element (e.g. $M_t(i)$) from the matrix of the NVM array and instead sets the corresponding read vector value (e.g. $W_t(i)M_t(i)$) to zero to save processing time resources. It is noted that most of the elements of Wt are expected to be lower than TH due to the aforementioned sparseness.

At decision block 514, the NTM controller determines if additional values of $M_t$ are to be processed and, if so, processing returns to block 504 where i is incremented and the process is repeated for the next $W_t(i)$). Once all $M_t$ values have been processed, the NTM controller sums $W_t(i)M_t(i)$ for all i as in Eq. 2 above, where, as already explained, some of the $W_t(i)M_t(i)$ values are set to 0. Alternatively, the summation of block 516 may be performed iteratively following blocks 510/512 so that only the on-going sum needs to be stored in the volatile memory of the controller at any given time, rather than each value of $W_t(i)$ and $M_t(i)$.

Note that in FIG. 5 the only processing block that accesses the NVM array is block 508. The operations of the other processing blocks may be performed by the NTM controller (which may be a hardware component) using fast volatile memory (such as RAM) or fast non-volatile memory such as storage class memory (e.g., MRAM, ReRAM, PCM), and hence may be performed without significant computational or storage access latencies. By bypassing blocks 508 and 510 when the weight is small (i.e. below the threshold TH), the relatively slow NVM read operation of block 508 is avoided, thus expediting overall processing speed.

On-Chip Threshold-Based NTM Read Operations

Figure 6:
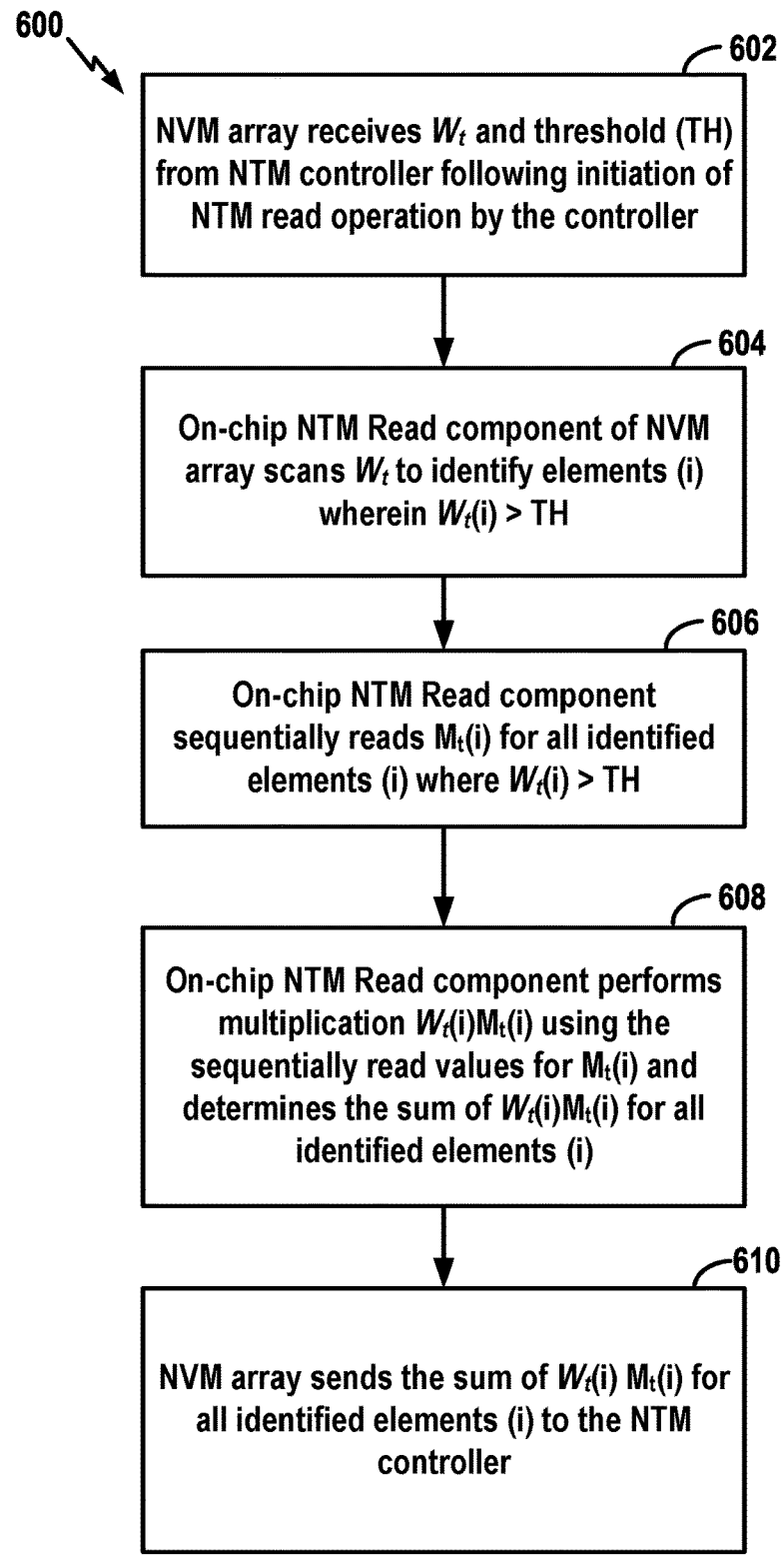
FIG. 6 illustrates an exemplary threshold-based method for use by on-chip circuitry of an NVM array for determining whether to read data from an NTM matrix of the NVM array.

FIG. 6 illustrates an exemplary method 600 for use with NTM read processing according to aspects of the present disclosure wherein threshold-based NTM read processing is performed by on-chip components of the NVM array. That is, the weight-vs.-threshold comparison is conducted in the NVM array to facilitate sequential reads that involve skipping wordlines (or FMUs) that correspond to low weights. In an exemplary embodiment, the weight vector Wt and the threshold (TH) are passed by the NTM controller to the NVM array. Then, the weight vector is scanned so only the elements (e.g. WLs) where $W_t(i) > TH$ are identified. This operation can be performed either in the memory array or in the NTM controller. Then, the NVM array reads the identified element (e.g. the identified WLs) sequentially, even if some elements are to be skipped (which is expected, as most of the elements of Wt should be lower than TH due to the aforementioned sparseness). The multiplication $W_t(i)M_t(i)$ then can be performed either in the NVM array or in the NTM controller. In the example of FIG. 6, operations that can be performed either in the NTM controller or in the NVM array are shown as being performed in the NVM array. It should be understood that in other examples, one or more of these operations can instead be performed in the NTM controller.

Beginning at block 602, the NVM array (e.g. array 114 of FIG. 1) receives vector $W_t$ and the threshold (TH) from the NTM controller (e.g. controller 116 of FIG. 1) following initiation an NTM read operation by the NTM controller. At block 604, an on-chip NTM read component (such as read computation component 212 of FIG. 2) of the NVM array scans $W_t$ to identify elements (i) wherein $W_t(i) > TH$. As noted above, TH is set to a small value to identify weight values that can be omitted from the NTM read operation due to their small contribution to the final read result. At block 606, the on-chip NTM read component of the NVM array sequentially reads $M_t(i)$ for all identified elements (i) where $W_t(i) > TH$. At block 608, the on-chip NTM read component of NVM array performs the multiplication $W_t(i)M_t(i)$ using the sequentially read values for $M_t(i)$ and determines the sum of $W_t(i)M_t(i)$ for all identified elements (i). At block 610, the NVM array sends the sum of $W_t(i)M_t(i)$ for all identified elements (i) to the NTM controller. Although not shown, the process may then be repeated for a next time value t. Note that the operations of block 608 may instead be performed by the NTM controller using data sent from the NVM array.

On-Chip Threshold-Based NTM Write Operations

Figure 7:
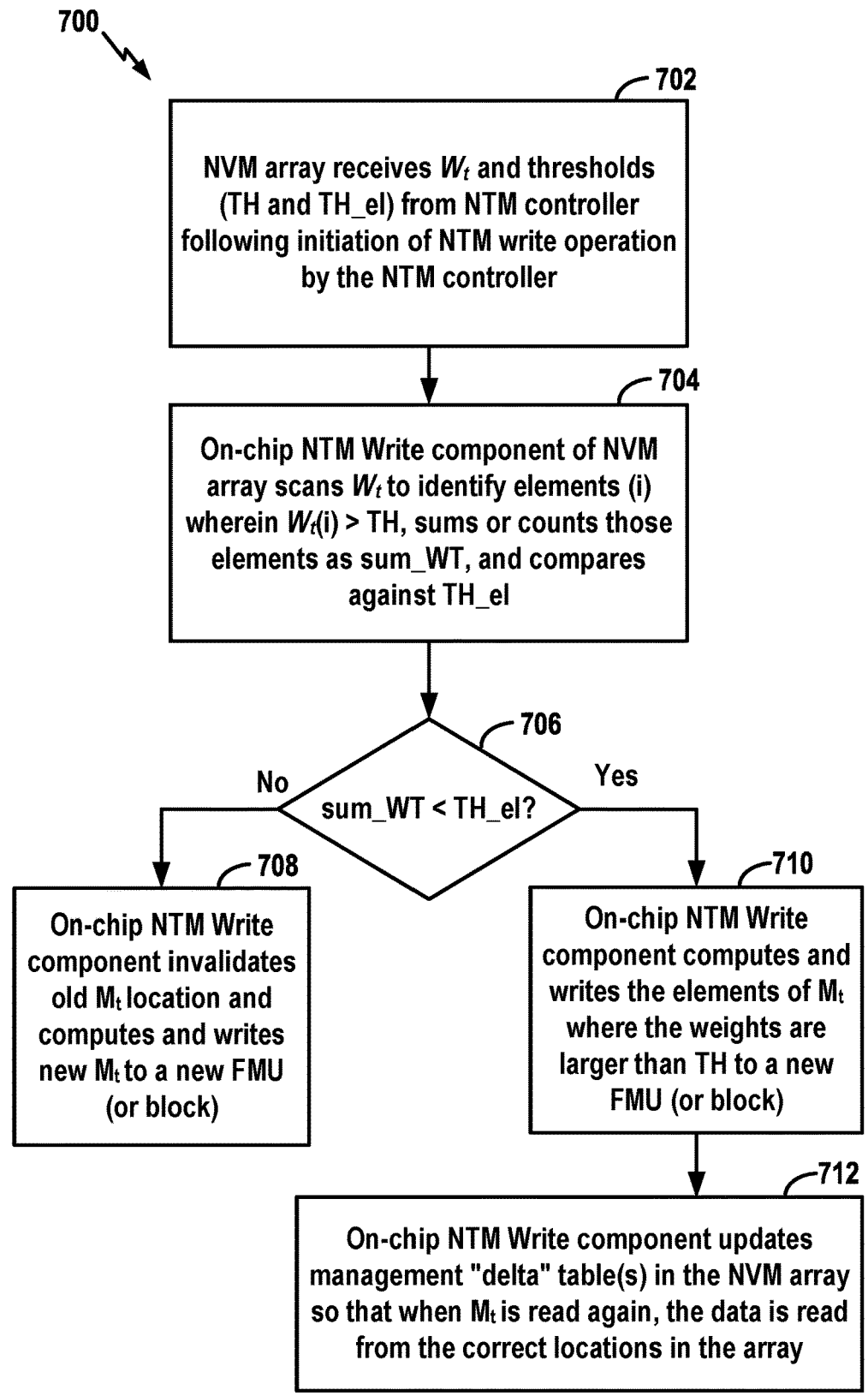
FIG. 7 illustrates an exemplary threshold-based method for use by on-chip circuitry of an NVM array for controlling NTM matrix write operations within the NVM array.

FIG. 7 illustrates an exemplary method 700 for use with NTM write processing according to aspects of the present disclosure wherein the threshold-based NTM write processing is performed by on-chip components of the NVM array. In current flash-based NVM devices, e.g. flash NANDs, there is no option for performing erasure (of the type indicated by the erase element e in Eq. 3 above). Hence, issues arise when attempting to implement NTM write operations using NTM data stored in an NVM array that does not accommodate erasure. One option is to use a RAM buffer of the size $M_t$ (that is much smaller than the entire NVM flash memory space) and perform the operations of Eq. 3 and Eq. 4 in that buffer, while writing the result to the NVM array. A relatively straightforward approach would involve writing the entire result of Eq. 4 to new blocks in the NVM array and invalidating the old representation of $M_t$ in the NVM array. This, however, may have much considerable redundancy since the vector $W_t$ is expected to be sparse during the operations of Eq. 3 and Eq. 4, i.e. the number of modifications is expected to be relatively small due to the sparseness.

In the example of FIG. 7, $W_t$ thresholds are instead exploited during NTM write operations to facilitate the NTM write while eliminating much of the aforementioned redundancy. For example, the number of elements of $W_t$ that exceed a first threshold TH may be identified and recorded. Then, based on the number of such elements (or their sum), on-chip circuitry in the NVM array decides whether writing an entire $M_t$ buffer is worthwhile or whether only modifications should be written to a new NVM FMU or block (while recording in a memory management "delta" table that these elements thereafter should be read from another location when reading the new $M_t$.) This can to reduce the number of block erasures and the program/erase cycles as compared with the straightforward approached noted above (at the cost of adding additional firmware and incurring some flash management overhead).

FIG. 7 illustrates an exemplary threshold-based write procedure. It is noted that several of the processing operations can be implemented using on-chip circuitry in the NVM array or using the NTM controller. In the example of FIG. 7, an implementation exploiting on-chip circuitry to perform these operations is shown. Beginning at block 702, the NVM array (e.g. array 114 of FIG. 1) receives vector $W_t$, a first threshold (TH) and a second threshold (TH_el) from the NTM controller (e.g. controller 116 of FIG. 1) following initiation of an NTM write operation by the controller.

At block 704, an on-chip NTM Write component of the NVM array (such as write vector computation components 214 of FIG. 2) scans $W_t$ to identify elements (i) wherein $W_t(i) > TH$ and then sums or counts those identified elements as sum_WT. That is, in one example sum_WT represents the sum of all of the weight elements found to exceed TH. In another example, sum_WT represents the numerical count of those elements. As noted, TH may be set to a small value to identify weight values that can be omitted from the NTM read operation due to their small contribution to the final read result. At block 704, the on-chip NTM Write component also compares sum_WT against TH_el. Assuming sum_WT is a computed as a sum of weights that exceed TH, then TH_el is set to a larger value that TH. In one example, if TH is set to 0.0001 or in the range of 0.00001 to 0.001, TH_el may be set to 0.001 or in the range of 0.0001 to 0.01. If sum_WT instead represents a count of the number of number of weights that exceed TH, rather than a sum of those weights, then TH_el may be set to an appropriate numerical count threshold.

As shown by decision block 706, if sum_WT is not below TH_el, then, at block 708, the on-chip NTM write component invalidates the old (or current) location of the $M_t$ in the NVM array and then computes and writes new $M_t$ values to a new FMU (or block) within the NVM array. The computations may be performed in accordance with Equations 3 and 4, above.

On the other hand, if at decision block 706, sum_WT is found to be below TH_el, then, at block 710, the on-chip NTM write component of the NVM array computes and writes the elements of $M_t$ where the weights are larger than TH to a new FMU (or block). At block 712, the on-chip NTM write component update management "delta" table(s) in the array so that when $M_t$ is subsequently read, the data is read from the correct location. This is done, e.g., to account for the fact that in some cases the entire matrix $M_t$ is written to a new location in the NVM array at block 708 and, in other cases, only particular elements of the matrix are written to new locations at block 712. Although not shown in FIG. 7, the NVM array may then output the results of the NTM write operation to the NTM controller for use in further processing. Furthermore, although not shown, the overall NTM write process may be repeated for a next time value t. Note also that the operations of blocks 704 and 706 may instead be performed by the NTM controller. That is, in some examples, the NTM controller: scans $W_t$ to identify elements (i) wherein $W_t(i)>TH$; sums or counts those identified elements as sum_WT; and compares sum_WT against TH_el. The NTM controller then controls the NVM array to perform the operations of blocks 708 and 710/712, depending upon the decision at block 706.

Additional Exemplary Methods and Apparatus for NTM Processing

Figure 8:
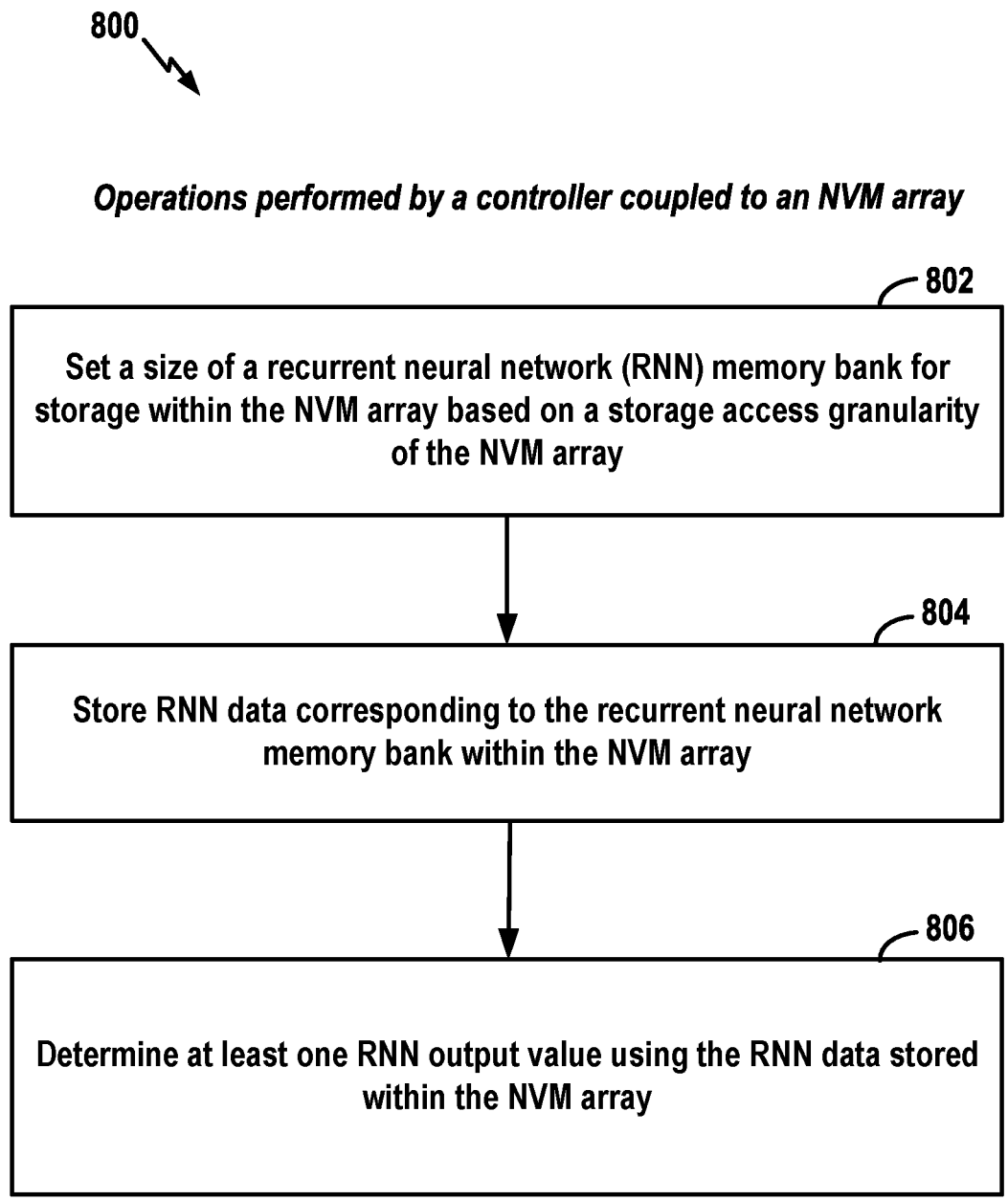
FIG. 8 is a flow chart that summarizes exemplary operations performed by a controller coupled to an NVM array.

FIG. 8 broadly illustrates a process 800 in accordance with some aspects of the disclosure. The process 800 may take place within any suitable apparatus or device capable of performing the operations that is coupled to an NVM array, such as a flash memory controller or other solid state memory controller. At block 802, the device sets a size of an RNN memory bank for storage within the NVM array based on the storage access granularity of the NVM array. See, examples above, where the storage access granularity is one FMU and the size of an NTM matrix of the RNN is set to an integer number of FMUs. At block 804, the device stores RNN data corresponding to the RNN memory bank within the NVM array. At block 806, the device determines at least one RNN output value using the RNN data stored within the NVM array, such as by determining one or more NTM read head output values or MANN read output values.

FIG. 9 broadly illustrates another process 900 in accordance with some aspects of the disclosure. The process 900 may take place within any suitable apparatus or device capable of performing the operations that is coupled to an NVM array, such as a flash memory controller or other solid state memory controller. At block 902, the device sets a size of an NTM matrix or memory bank based on NVM read/write access granularity to be equal to (or at least no greater than) the size of an integer (k) number of FMUs, word-lines, blocks, or meta-blocks. At block 904, the device stores NTM matrix elements within the NVM array in accordance with the read/write granularity. At block 906, the device trains a recurrent neural network (such as a MANN) using input label images or other data by performing read vector and write vector operations on the NTM matrix elements stored within the NVM array.

Figure 10:
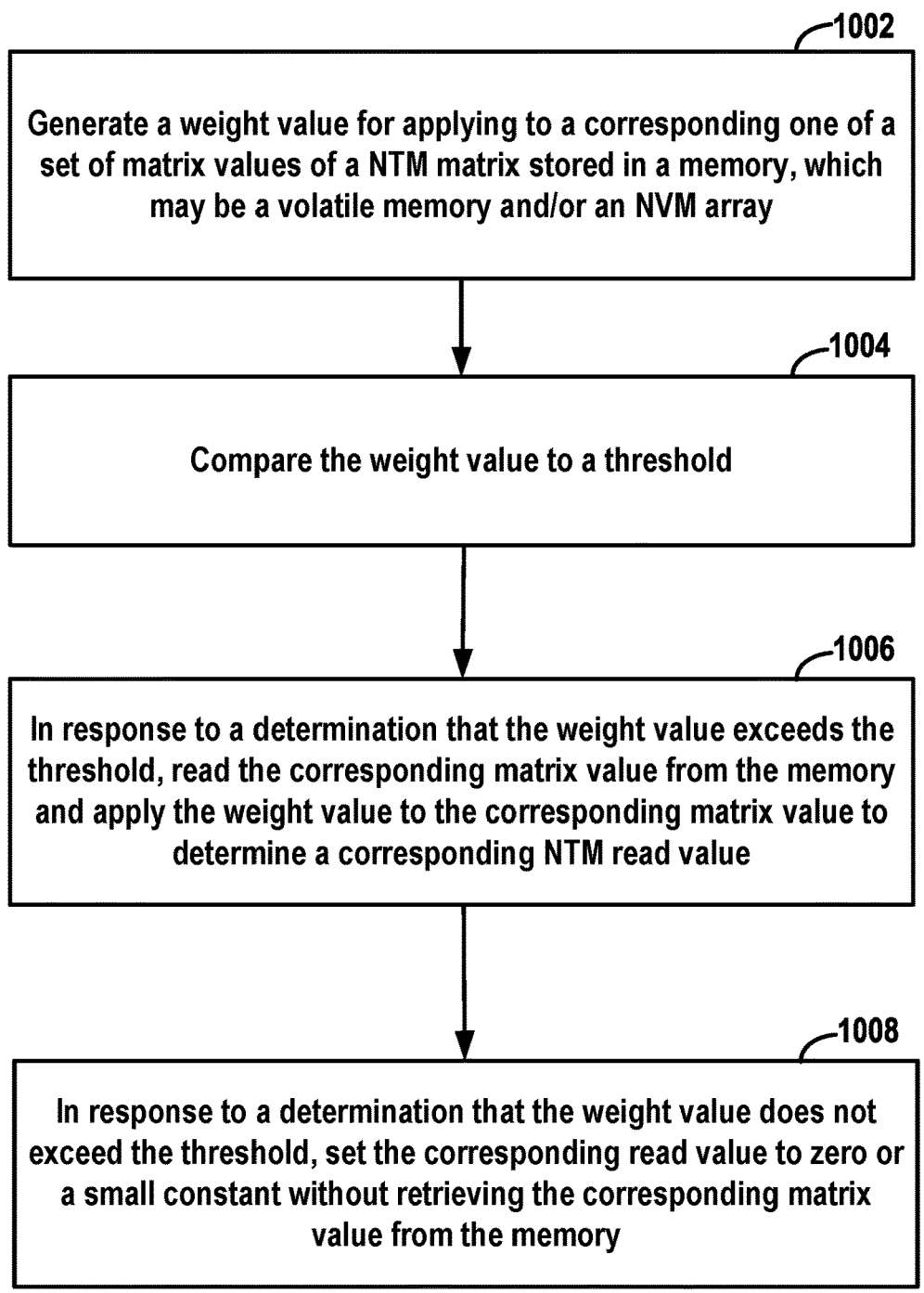
FIG. 10 is a flow chart that summarizes exemplary operations performed by a controller coupled to a memory, which may be a volatile memory or an NVM.

FIG. 10 broadly illustrates another process 1000 in accordance with some aspects of the disclosure. The process 1000 may take place within any suitable apparatus or device capable of performing the operations that is coupled to a memory, such as a volatile memory or an NVM array. At block 1002, the device generates a weight value for applying to a corresponding one of a set of matrix values of a NTM matrix stored in the memory. At block 1004, the device compares the weight value to a threshold. At block 1006, in response to a determination that the weight value exceeds the threshold, the device reads the corresponding matrix value from the memory and applies the weight value to the corresponding matrix value to determine a corresponding read value. At block 1008, in response to a determination that the weight value does not exceed the threshold, the device sets the corresponding read value to zero or a small constant without retrieving the corresponding matrix value from the memory. In embodiments where the memory is an NVM, significant latencies can be avoided by not retrieving the corresponding matrix value from the NVM. However, even in embodiments where the memory is a volatile memory such as RAM or other fast non-volatile memory such as storage class memory (e.g., MRAM, ReRAM, PCM), at least some latency can be avoided.

Figure 11:
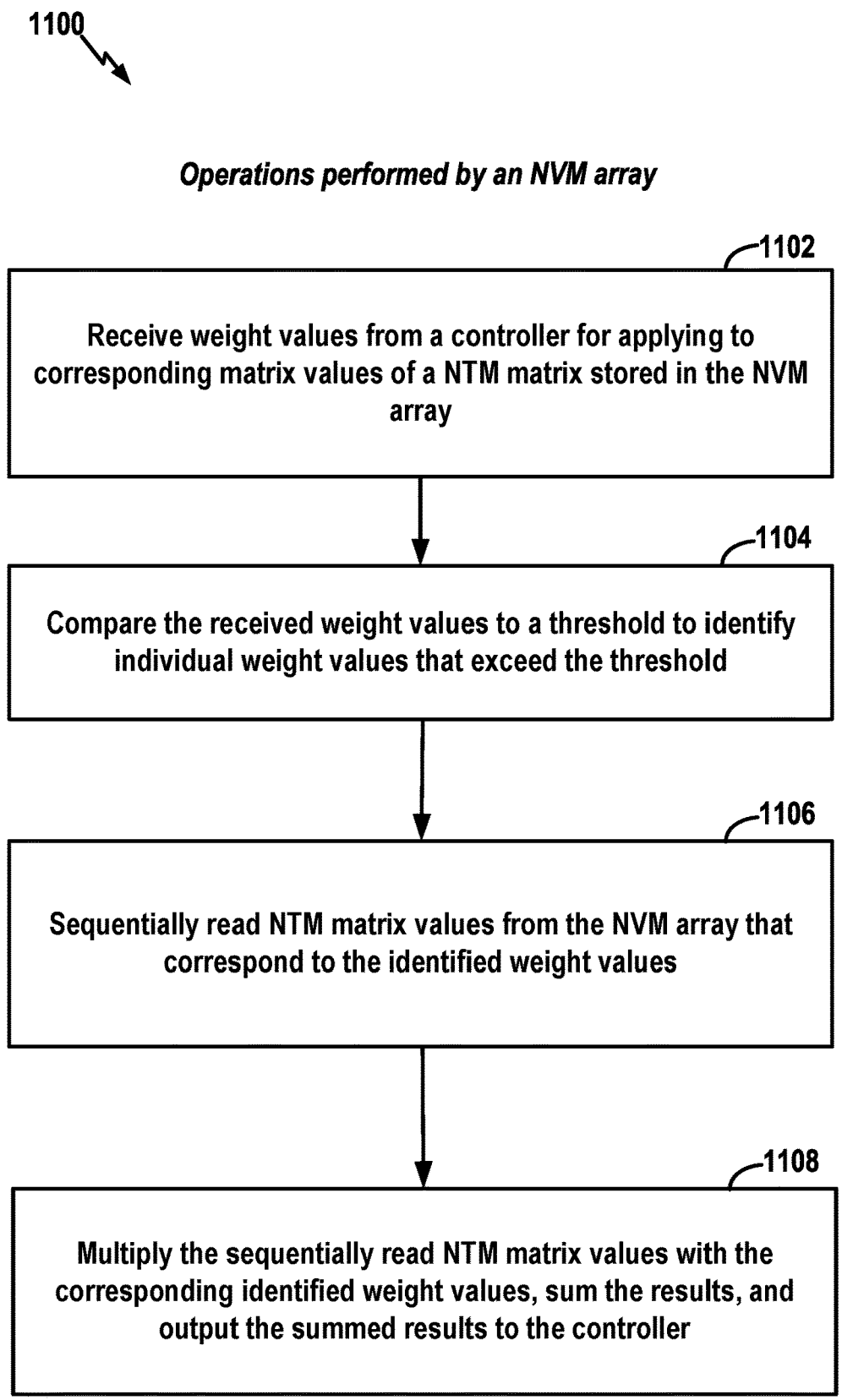
FIG. 11 is a flow chart that summarizes exemplary operations performed by components of an NVM array.

FIG. 11 broadly illustrates another process 1100 in accordance with some aspects of the disclosure. The process 1100 may take place within any suitable NVM array or other apparatus or device capable of performing the operations. At block 1102, the NVM array receives a threshold and NTM weight values from a controller (which may be, e.g. a flash controller or other solid state memory controller) for applying to a corresponding NTM matrix values stored within the NVM array. At block 1104, the NVM array compares the received weight values to the threshold to identify individual weight values that exceed the threshold. At block 1106, the NVM array sequentially reads NTM matrix values from the NVM array that correspond to the identified weight values. At block 1108, the NVM array multiplies the sequentially read NTM matrix values with the corresponding identified weight values, sums the results, and outputs the summed results to the controller. In other examples, at least some of these operations may be performed by the controller.

Figure 12:
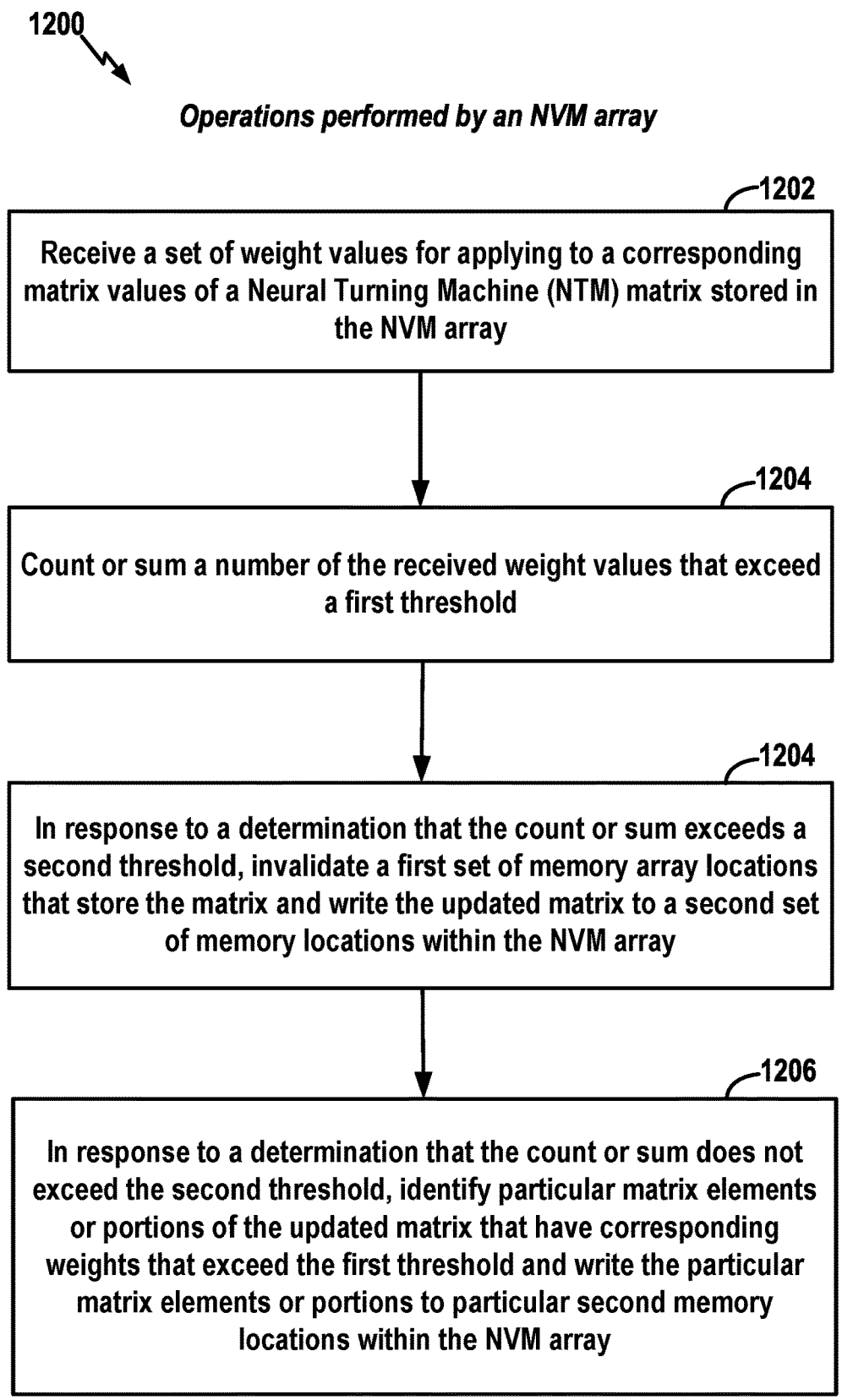
FIG. 12 is a flow chart that summarizes further exemplary operations performed by components of an NVM array.

FIG. 12 broadly illustrates another process 1200 in accordance with some aspects of the disclosure. The process 1200 may take place within any suitable NVM array or other apparatus or device capable of performing the operations. At block 1202, the NVM array receives a set of weight values for applying to a corresponding matrix values of a NTM matrix stored in the NVM array. At block 1202, the NVM array counts or sums a number of the received weight values that exceeds a first threshold. At block 1204, in response to a determination that the count or sum exceeds a second threshold, the NVM array invalidates a first set of memory array locations that store the matrix and writes the updated matrix to a second set of memory locations within the NVM array. At block 1206, in response to a determination that the count or sum does not exceed the second threshold, the NVM array identifies particular matrix elements or portions of the updated matrix that have corresponding weights that exceed the first threshold and writes the particular matrix elements or portions to particular second memory locations within the NVM array.

Figure 13:
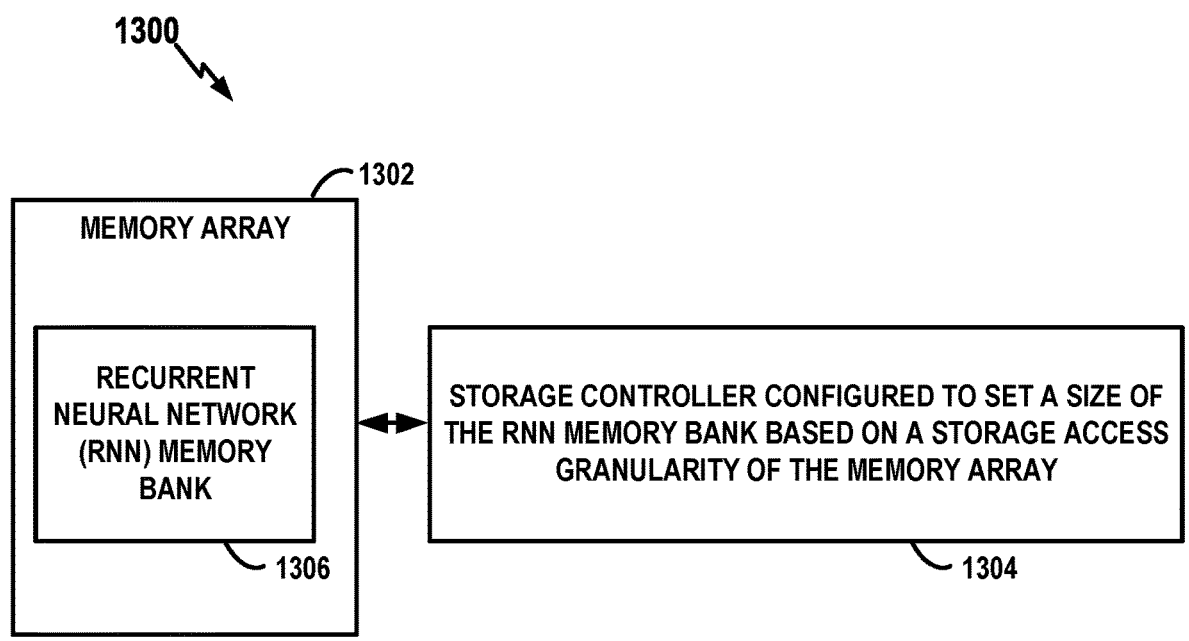
FIG. 13 is a schematic block diagram configuration for an exemplary DSD having an NVM storing a recurrent neural network (RNN) memory bank such as an NTM matrix.

FIG. 13 illustrates an embodiment of an apparatus 1300 configured according to one or more aspects of the disclosure. The apparatus 1300, or components thereof, could embody or be implemented with a NAND die or some other type of NVM array that supports data storage along with a storage controller (which may be, for example, a flash controller or other solid state memory controller). The apparatus 1300 includes an NVM array 1302. The apparatus 1300 also includes a controller 1304 configured to set a size of a RNN memory bank 1306 stored within the memory array 1302 based on a storage access granularity of the memory array 1302. See, the examples above where the storage access granularity is one FMU and the size of a RNN memory bank (e.g. NTM matrix) is set to an integer number of FMUs.

Exemplary NAND Die of Other Apparatus for On-Chip NTM Processing

Figure 14:
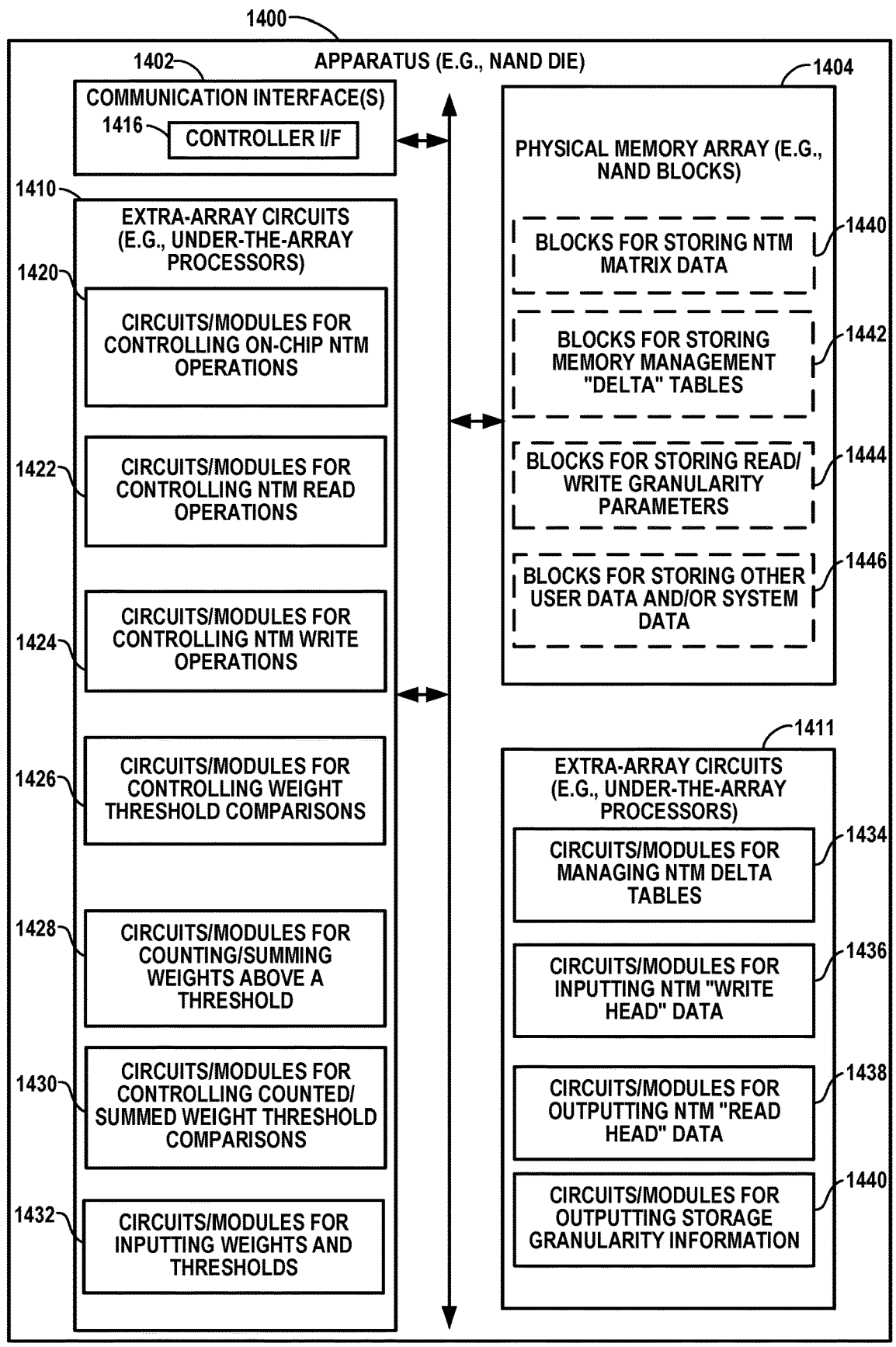
FIG. 14 is a schematic block diagram configuration for an exemplary apparatus such as a NAND die, with on-chip NTM processing components.

FIG. 14 illustrates an embodiment of an apparatus 1400 configured according to one or more aspects of the disclosure. The apparatus 1400, or components thereof, could embody or be implemented within a NAND die or some other type of NVM device that supports data storage. In various implementations, the apparatus 1400, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural data.

The apparatus 1400 includes a communication interface 1402, a physical memory array (e.g., NAND blocks) 1404, and extra-array processing circuits 1410, 1411 (e.g. under-the-array or next-to-the-array circuits). These components can be coupled to and/or placed in electrical communication with one another via suitable components, represented generally by the connection lines in FIG. 14. Although not shown, other circuits such as timing sources, peripherals, voltage regulators, and power management circuits may be provided, which are well known in the art, and therefore, will not be described any further.

The communication interface 1402 provides a means for communicating with other apparatuses over a transmission medium. In some implementations, the communication interface 1402 includes circuitry and/or programming (e.g., a program) adapted to facilitate the communication of information bi-directionally with respect to one or more devices in a system. In some implementations, the communication interface 1402 may be configured for wire-based communication. For example, the communication interface 1402 could be a bus interface, a send/receive interface, or some other type of signal interface including circuitry for outputting and/or obtaining signals (e.g., outputting signal from and/or receiving signals into an SSD). The communication interface 1402 serves as one example of a means for receiving and/or a means for transmitting.

The physical memory array 1404 may represent one or more NAND blocks. The physical memory array 1404 may be used for storing NTM data manipulated by the circuits 1410, 1411 or some other component of the apparatus 1400. The physical memory array 1404 may be coupled to the circuits 1410, 1411 such that the circuits 1410, 1411 can read or sense information from, and write or program information to, the physical memory array 1404. That is, the physical memory array 1404 can be coupled to the circuits 1410, 1411 so that the physical memory array 1404 is accessible by the circuits 1410, 1411.

The circuits 1410, 1411 are arranged or configured to obtain, process and/or send data, control data access and storage, issue or respond to commands, and control other desired operations. For example, the circuits 1410, 1411 may be implemented as one or more processors, one or more controllers, and/or other structures configured to perform functions. According to one or more aspects of the disclosure, the circuits 1410, 1411 may be adapted to perform any or all of the extra-array features, processes, functions, operations and/or routines described herein. For example, the circuits 1410 may be configured to perform any of the steps, functions, and/or processes described with respect to FIGS. 2-13. As used herein, the term "adapted" in relation to the processing circuits 1410, 1411 may refer to the circuits being one or more of configured, employed, implemented, and/or programmed to perform a particular process, function, operation and/or routine according to various features described herein. The circuits may include a specialized processor, such as an application specific integrated circuit (ASIC) that serves as a means for (e.g., structure for) carrying out any one of the operations described in conjunction with FIGS. 2-13. The circuits serve as an example of a means for processing. In various implementations, the circuits may provide and/or incorporate, at least in part, functionality described above for the components in various embodiments shown, including for example component 204 of FIG. 2.

According to at least one example of the apparatus 1400, the processing circuit 1410, 1411 may include one or more of: circuit/modules 1420 configured for controlling and managing on-chip NTM operations; circuits/modules 1422 configured for controlling NTM read operations (such as those shown in FIG. 6); circuits/modules 1424 configured for controlling NTM write operations (such as those shown in FIG. 7); circuits/modules 1426 configured for controlling weight threshold comparisons (such as shown of block 606 of FIG. 6); circuits/modules 1428 configured for counting and/or summing weights above a first threshold (such as shown in block 706 of FIG. 7); circuits/modules 1430 configured for controlling counted/summed weight threshold comparisons (such as shown in block 708 of FIG. 7); circuits/modules 1432 configured for inputting weights and thresholds (such as shown in block 702 of FIG. 6 and block 704 of FIG. 702); circuits/modules 1434 configured for managing NTM delta tables (such as shown in block 714 of FIG. 7); circuits/modules 1436 configured for inputting NTM "read head" data (including any data needed for the apparatus 1400 to perform NTM "read head" operations in embodiments where the apparatus 1400 is configured to perform such operations); circuits/modules 1438 configured for outputting NTM "write head" data (including any data to be output from the apparatus 1400 as a part of NTM "write head" operations in embodiments where the apparatus 1400 is configured to perform such operations); and circuits/modules 1440 configured for outputting storage granularity information or parameters (such as the parameters in memory block 1444 during boot up).

As shown in FIG. 14, the physical memory array 1404 may include one or more of: blocks 1440 for storing NTM matrix or memory block data; blocks 1442 for storing memory management "delta" table data; blocks 1444 for storing read/write access granularity parameters (which may be stored in a separate boot partition); and blocks 1446 for storing other user data or system data (e.g. data pertaining to the overall control of operations of the NAND die).

In at least some examples, means may be provided for performing the functions illustrated in FIG. 14 and/or other functions illustrated or described herein. For example, the means may include one or more of: means, such as circuit/module 1420, for controlling and managing on-chip NTM operations; means, such as circuits/modules 1422, for controlling NTM read operations (such as those shown in FIG. 6); means, such as circuits/modules 1424, for controlling NTM write operations (such as those shown in FIG. 7); means, such as circuits/modules 1426, for controlling weight threshold comparisons (such as shown of block 606 of FIG. 6); means, such as circuits/modules 1428, for counting and/or summing weights above a first threshold (such as shown in block 706 of FIG. 7); means, such as circuits/modules 1430, for controlling counted/summed weight threshold comparisons (such as shown in block 708 of FIG. 7); means, such as circuits/modules 1432, for inputting weights and thresholds (such as shown in block 702 of FIG. 6 and block 704 of FIG. 702); means, such as circuits/modules 1434, for managing NTM delta tables (such as shown in block 714 of FIG. 7); means, such as circuits/modules 1436, for inputting NTM "read head" data (including any data needed for the apparatus 1400 to perform NTM "read head" operations in embodiments where the apparatus

1400 is configured to perform such operations); means, such as circuits/modules 1438, for outputting NTM "write head" data (including any data to be output from the apparatus 1400 as a part of NTM "write head" operations in embodiments where the apparatus 1400 is configured to perform such operations); and means, such as circuits/modules 1440, for outputting storage granularity information or parameters (such as the parameters in memory block 1444 during boot up).

In yet another aspect of the disclosure, a non-transitory computer-readable medium is provided that has one or more instructions which when executed by a processing circuit in a DSD controller or an NVM die causes the controller to perform one or more of the functions or operations listed above. The controller may be, for example, a flash controller or other solid state memory controller.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NAND flash memory, such as 3D NAND flash memory, and other types of semiconductor memory including the volatile and non-volatile memory devices listed below. Semiconductor memory devices include volatile memory devices, such as DRAM or SRAM devices, NVM devices, such as ReRAM, EEPROM, flash memory (which can also be considered a subset of EEPROM), ferroelectric random access memory (FRAM), storage class memory, and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage device, comprising:
   a non-volatile memory (NVM) array configured to store Neural Turing Machine (NTM) data, the NVM array having a storage access granularity, wherein the NVM array includes a die with on-chip circuitry configured to perform NTM read vector operations and NTM write vector operations on the NTM data; and
   a controller coupled to the NVM array, the controller comprising one or more processors configured, individually or in combination, to:
      set a size of an NTM matrix for storage within the NVM array based on the storage access granularity of the NVM array;
      store the NTM data within the NTM matrix of the NVM array; and
      determine at least one NTM output value using the NTM data stored within the NTM matrix of the NVM array by being further configured to control the on-chip circuitry of the die of the NVM array to perform an NTM write vector operation by controlling the on-chip circuitry to:
         receive a set of NTM weight values from the controller;
         count or sum weight values in the set of NTM weight values that exceed a first non-zero threshold; and
         selectively update all or a portion of the NTM matrix within the NVM array based on whether the count or the sum exceeds a second non-zero threshold.

2. The data storage device of claim 1, wherein the storage access granularity of the NVM array is based on a memory unit comprising a flash memory unit (FMU), a word-line, a block, and a meta-block.

3. The data storage device of claim 1, wherein the storage access granularity of the NVM array comprises a flash memory unit (FMU), and wherein the processor is configured to set the size of the NTM memory bank based on a size of an integer number of the FMUs.

4. The data storage device of claim 3, wherein the one or more processors are further configured, individually or in combination, to set the size of the NTM memory bank equal to the size of the integer number of the FMUs.

5. The data storage device of claim 3, wherein the one or more processors are further configured, individually or in combination, to set the size of the NTM memory bank to be less than the size of the integer number of the FMUs and greater than the size of the integer number minus one of the FMUs.

6. The data storage device of claim 1, wherein the NTM memory bank is a matrix of size N×D, and wherein the one or more processors are further configured, individually or in combination, to set one or both of N and D based on the storage access granularity of the NVM array.

7. The data storage device of claim 1, wherein the one or more processors are further configured, individually or in combination, to:
   generate an NTM weight value for applying to a corresponding one of a set of NTM matrix values stored within the NVM array;
   compare the generated weight value to the first non-zero threshold;
   retrieve the corresponding matrix value from the NVM array, in response to a determination that the weight value exceeds the first non-zero threshold, and apply the weight value to the corresponding matrix value to determine a corresponding NTM read value; and
   set the corresponding NTM read value to zero or a constant value, in response to a determination that the weight value does not exceed the first non-zero threshold, without retrieving the corresponding matrix value from the NVM array.

8. The data storage device of claim 1, wherein the on-chip circuitry is further controlled to:
   receive the first threshold and NTM weight values from the controller for applying to corresponding NTM matrix values stored within the NVM array;
   compare the received weight values to the first threshold to identify individual weight values that exceed the threshold;
   sequentially read NTM matrix values from the NVM array that correspond to the identified weight values;
   multiply the sequentially read NTM matrix values with the corresponding identified weight values;
   sum the results of the multiplication of the sequentially read NTM matrix values with the corresponding identified weight values; and
   output the summed results to the controller.

9. The data storage device of claim 1, wherein the on-chip circuitry is controlled to selectively update all or a portion of the NTM matrix by being further controlled to:
   invalidate, in response to a determination that the count or the sum exceeds the second non-zero threshold, a first set of memory array locations that store the NTM matrix and compute and write an updated NTM matrix to a second set of memory locations within the NVM array; and
   identify, in response to a determination that the count or the sum does not exceed the second non-zero threshold, portions of the updated NTM matrix that have corresponding weights that exceed the first threshold and write the portions of the updated NTM matrix to the second memory locations within the NVM array.

10. The data storage device of claim 1, wherein the on-chip circuitry of the NVM array is further controlled to update an NVM management table stored in the NVM array to identify the second memory locations of the NVM array.

11. The data storage device of claim 1, wherein the NVM array comprises a NAND NVM array.

12. The data storage device of claim 1, wherein the one or more processors are further configured, individually or in combination, to train a recurrent neural network by being further configured to control the on-chip circuitry of the die of the NVM array to perform the NTM read vector operations and the NTM write vector operations on attentionally-selected portions of the NTM matrix.

13. A method for use by a controller coupled to a non-volatile memory (NVM) array, wherein the NVM array includes a die with on-chip circuitry configured to perform Neural Turing Machine (NTM) read vector operations and NTM write vector operations on NTM data, the method comprising:

setting a size of an NTM matrix for storage within the NVM array based on a storage access granularity of the NVM array;

storing the NTM data within the NTM matrix of the NVM array; and determining at least one NTM output value using the NTM data stored within the NTM matrix of the NVM array by controlling the on-chip circuitry of the die of the NVM array to perform at least one NTM write vector operation by:

receiving a set of NTM weight values from the controller;

counting or summing weight values in the set of NTM weight values that exceed a first non-zero threshold; and selectively updating all or a portion of the NTM matrix within the NVM array based on whether the count or the sum exceeds a second non-zero threshold.

14. The method of claim 13, wherein the storage access granularity of the NVM array is based on a memory unit comprising a flash memory unit (FMU), a word-line, a block, and a meta-block.

15. The method of claim 13, wherein the storage access granularity of the NVM array comprises a flash memory unit (FMU), and wherein the size of the NTM memory bank is set based on a size of an integer number of the FMUs.

16. The method of claim 15, wherein the size of the NTM memory bank is set equal to the size of the integer number of the FMUs.

17. The method of claim 16, wherein the size of the NTM memory bank is set to be less the size of the integer number of the FMUs and greater than the size of the integer number minus one of the FMUs.

18. The method of claim 13, wherein the NTM memory bank is a matrix of size N×D, and one or both of N and D are set based on the storage access granularity of the NVM array.

19. The method of claim 13, wherein the method further comprises:

generating an NTM weight value for applying to a corresponding one of a set of NTM matrix values stored within the NVM array;

comparing the generated weight value to the first non-zero threshold;

retrieving the corresponding matrix value from the NVM array, in response to a determination that the weight value exceeds the first non-zero threshold, and applying the weight value to the corresponding matrix value to determine a corresponding NTM read value; and setting the corresponding NTM read value to zero or a constant value, in response to a determination that the weight value does not exceed the first non-zero threshold, without retrieving the corresponding matrix value from the NVM array.

20. The method of claim 13, wherein the NVM array comprises a NAND NVM array.

21. The method of claim 13, wherein selectively updating all or a portion of the NTM matrix within the NVM array comprises:

invalidating, in response to a determination that the count or the sum exceeds the second non-zero threshold, a first set of memory array locations that store the NTM matrix and then computing an updated NTM matrix using the on-chip circuitry and writing the updated NTM matrix to a second set of memory locations within the NVM array; and identifying, in response to a determination that the count or the sum does not exceed the second zero threshold, portions of the updated NTM matrix that have corresponding weights that exceed the first threshold and writing the portions of the updated NTM matrix to the second memory locations within the NVM array.

22. A method for use by on-chip circuitry of a non-volatile memory (NVM) array, wherein the NVM array includes a die with on-chip circuitry configured to perform Neural Turing Machine (NTM) write vector operations on NTM data, the method comprising performing an NTM write vector operation using the on-chip circuitry of the die by:

receiving a set of NTM weight values from a controller for applying to a corresponding NTM matrix stored within the NVM array;

identifying weight values in the set of weight values that exceed a first non-zero threshold and counting or summing the identified weight values;

invalidating, in response to a determination that the count or a sum exceeds a second non-zero threshold, a first set of memory array locations that store the NTM matrix and computing an updated NTM matrix using the on-chip circuitry of the die and writing the updated NTM matrix to a second set of memory locations within the NVM array; and identifying, in response to a determination that the count or sum does not exceed the second non-zero threshold, portions of an updated NTM matrix that have corresponding weights that exceed the first non-zero threshold and writing the portions of the updated NTM matrix to second memory locations within the NVM array.

23. The method of claim 22, further comprising updating an NVM management table stored in the NVM array to identify the second memory locations of the NVM array.

24. A non-volatile memory (NVM) die, comprising:

NVM data storage blocks configured to store Neural Turing Machine (NTM) data comprising an NTM matrix;

on-chip NTM write vector circuitry on the die configured to:

receive a set of NTM weight values from a controller for applying to the NTM matrix stored within the data storage blocks of the NVM die;

identify weight values in the set of weight values that exceed a first non-zero threshold;

count or sum the identified weight values;

invalidate, in response to a determination that the count or a sum exceeds a second non-zero threshold, a first set of memory locations within the data storage blocks that store the NTM matrix and compute and write an updated NTM matrix to a second set of memory locations within the data storage blocks; and identify, in response to a determination that the count or sum does not exceed the second non-zero threshold, portions of the updated NTM matrix that have corresponding weights that exceed the first non-zero threshold and write the portions of the updated NTM matrix to the second memory locations within the NVM array.

* * * * *